US008349635B1

(12) United States Patent
Gan et al.

(10) Patent No.: US 8,349,635 B1
(45) Date of Patent: Jan. 8, 2013

(54) ENCAPSULATED MEMS DEVICE AND METHOD TO FORM THE SAME

(75) Inventors: Qing Gan, Fremont, CA (US); Emmanuel P. Quevy, El Cerrito, CA (US)

(73) Assignee: Silicon Laboratories Inc., Austin, TX (US)

( * ) Notice: Subject to any disclaimer, the term of this patent is extended or adjusted under 35 U.S.C. 154(b) by 438 days.

(21) Appl. No.: 12/124,043

(22) Filed: May 20, 2008

(51) Int. Cl.
*H01L 29/84* (2006.01)

(52) U.S. Cl. ............... 438/50; 438/51; 257/E29.324; 257/E23.18

(58) Field of Classification Search .............. 438/50–52, 438/54–55; 257/E23.001, E23.18, E29.324, 257/E21.48, E21.519
See application file for complete search history.

(56) References Cited

U.S. PATENT DOCUMENTS

| | | | | |
|---|---|---|---|---|
| 4,992,656 A * | 2/1991 | Clauser | ........................ | 250/251 |
| 5,656,889 A | 8/1997 | Niiyama et al. | | |
| 6,433,401 B1 * | 8/2002 | Clark et al. | .................... | 257/524 |
| 6,658,177 B1 * | 12/2003 | Chertkow | ........................ | 385/18 |
| 6,777,263 B1 * | 8/2004 | Gan et al. | ...................... | 438/106 |
| 6,777,267 B2 * | 8/2004 | Ruby et al. | ..................... | 438/113 |
| 6,822,880 B2 | 11/2004 | Kovacs et al. | | |
| 6,897,551 B2 | 5/2005 | Amiotti | | |
| 7,104,129 B2 | 9/2006 | Nasiri et al. | | |
| 7,166,910 B2 * | 1/2007 | Minervini | ..................... | 257/704 |
| 7,259,032 B2 * | 8/2007 | Murata et al. | .................. | 438/26 |
| 7,560,857 B2 * | 7/2009 | Chen et al. | .................... | 310/340 |
| 7,615,395 B2 | 11/2009 | Heuvelman | | |
| 7,633,150 B2 * | 12/2009 | Shiraishi | ........................ | 257/704 |
| 7,714,274 B2 * | 5/2010 | Degertekin et al. | ............ | 250/281 |
| 7,897,503 B2 * | 3/2011 | Foster et al. | .................. | 438/618 |
| 7,903,831 B2 * | 3/2011 | Song | ............................ | 381/174 |
| 2002/0017834 A1 * | 2/2002 | MacDonald | .................. | 310/328 |
| 2002/0130916 A1 * | 9/2002 | Gulvin et al. | ................... | 347/20 |
| 2002/0179921 A1 * | 12/2002 | Cohn | ............................ | 257/99 |
| 2003/0210453 A1 * | 11/2003 | Noda | ............................ | 359/290 |
| 2004/0029360 A1 * | 2/2004 | Geefay et al. | ................. | 438/459 |
| 2004/0046245 A1 * | 3/2004 | Minervini | ..................... | 257/704 |
| 2004/0061618 A1 * | 4/2004 | Haueis | ....................... | 340/686.1 |
| 2004/0077121 A1 * | 4/2004 | Maeda et al. | ................... | 438/75 |
| 2004/0115856 A1 * | 6/2004 | Jung et al. | ....................... | 438/50 |
| 2004/0150829 A1 * | 8/2004 | Koch et al. | ..................... | 356/477 |
| 2004/0214380 A1 * | 10/2004 | Leib et al. | ...................... | 438/151 |
| 2005/0002084 A1 * | 1/2005 | Wan | .............................. | 359/291 |
| 2005/0167795 A1 * | 8/2005 | Higashi | ........................ | 257/678 |
| 2005/0168306 A1 * | 8/2005 | Cohn et al. | ...................... | 335/78 |

(Continued)

OTHER PUBLICATIONS

"This Month in Physics History. May 1801: Thomas Young and the Nature of Light", APS Physics, vol. 17, No. 5, (May 2008).*

(Continued)

*Primary Examiner* — Jarrett Stark
*Assistant Examiner* — Michele Fan
(74) *Attorney, Agent, or Firm* — Zagorin O'Brien Graham LLP

(57) ABSTRACT

An encapsulated MEMS device and a method to form an encapsulated MEMS device are described. An apparatus includes a first substrate having a silicon-germanium seal ring disposed thereon and a second substrate having a metal seal ring disposed thereon. The metal seal ring is aligned with and bonded to the silicon-germanium seal ring to provide a sealed cavity. A MEMS device is housed in the sealed cavity. A method includes forming a silicon-germanium seal ring on a first substrate and forming a metal seal ring on a second substrate. The metal seal ring is bonded to the silicon-germanium seal ring to provide a sealed cavity that houses a MEMS device.

24 Claims, 10 Drawing Sheets

U.S. PATENT DOCUMENTS

| | | | | |
|---|---|---|---|---|
| 2005/0250253 A1* | 11/2005 | Cheung | | 438/125 |
| 2006/0062420 A1* | 3/2006 | Araki | | 381/396 |
| 2006/0076634 A1* | 4/2006 | Palmateer et al. | | 257/415 |
| 2006/0076648 A1* | 4/2006 | Gally et al. | | 257/619 |
| 2006/0105503 A1* | 5/2006 | Ding et al. | | 438/125 |
| 2007/0189558 A1* | 8/2007 | Ogura et al. | | 381/191 |
| 2007/0273728 A1* | 11/2007 | Bryant et al. | | 347/54 |
| 2008/0089536 A1* | 4/2008 | Josefsson | | 381/113 |
| 2009/0041270 A1* | 2/2009 | Schrank et al. | | 381/174 |

OTHER PUBLICATIONS

"Wave Optics, Interference", http://physics.ucsd.edu/students/courses/fall2009/physics1c/documents/5.1Two-slitinterference.pdf, (2009).*

CliffsNotes.com. Wave Optics. http://www.cliffsnotes.com/study_guide/topicArticleId-10453,articleId-10442.html, (Jun. 20, 2012).* thefreedictionary.com. Interference. http://encyclopedia2.thefreedictionary.com/p/Interference%20(wave%20motion), (2012).*

"Interference and Diffraction", http://web.pdx.edu/~bseipe1/203-CH23.pdf, (date unknown).*

Wolf, "The Opics of Microscope Image Formation", Methods in Cell Biology, 72, (2003): pp. 11-43.*

* cited by examiner

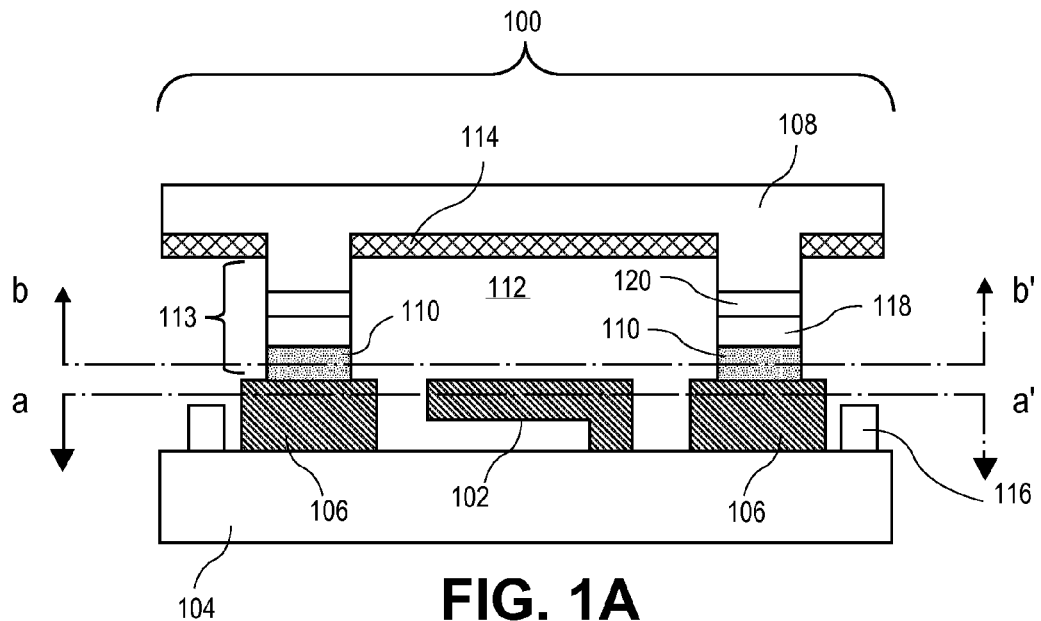
FIG. 1A
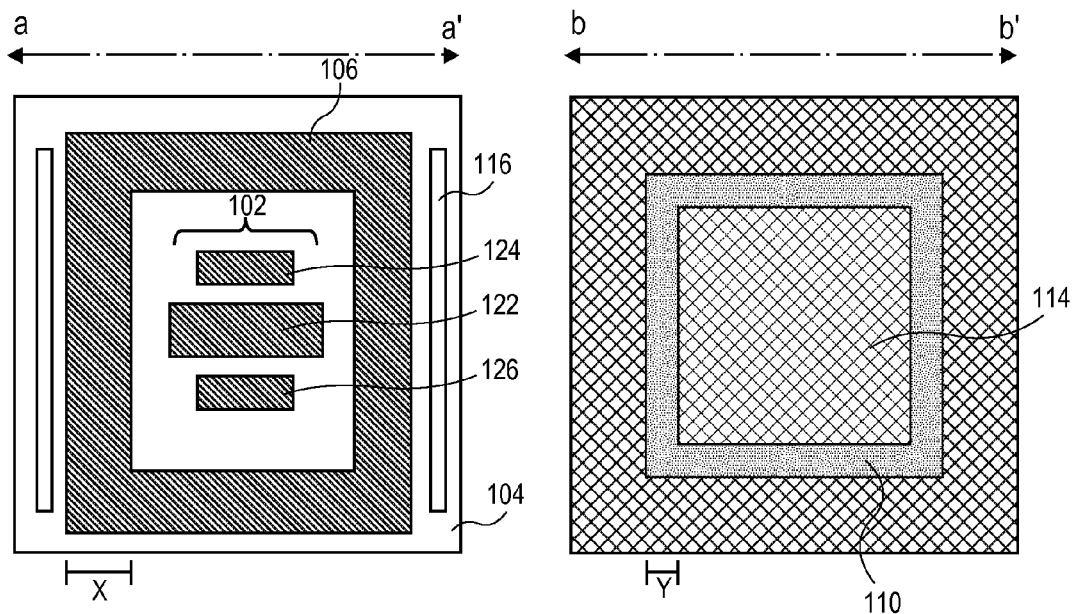
FIG. 1B     FIG. 1C

ENCAPSULATED MEMS DEVICE AND METHOD TO FORM THE SAME

BACKGROUND OF THE INVENTION

1) Field of the Invention

The invention is in the field of Microelectromechanical Systems (MEMS).

2) Description of Related Art

For the past several years, MEMS structures have been playing an increasingly important role in consumer products. For example, MEMS devices, such as sensors, detectors and mirrors, can be found in products ranging from air-bag triggers in vehicles to displays in the visual arts industry. In another example, high quality MEMS oscillators may be used in place of crystal oscillators to keep track of time and to provide a stable clock signal for digital integrated circuits. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictate that the processes used to fabricate such MEMS devices need to be extremely sophisticated.

Many devices, particularly MEMS devices, do not function properly when embedded in a completely solid environment. For example, a MEMS device may include a resonator or accelerometer fabricated on a substrate, each of which includes at least one element that must mechanically move relative to the substrate during operation. Freedom to move during operation would be lost if these elements were simply left embedded in a solid film deposited over the substrate, as is commonly done in the microelectronics industry. For this reason, a micromechanical structure must be released from the substrate so that it is not contained within a purely solid environment. However, a released micromechanical structure is fragile and must be protected with some form of package which isolates a microenvironment surrounding the micromechanical structure from a global environment surrounding the substrate. The package may further be hermetically sealed so that it can remain evacuated or pressurized with a gas or other fluidic media. One option is encapsulating a device in a conventional "TO can," well-known in the industry as a standard packaging method for a discrete device. However, this type of packaging is not wafer-level and is limited to stand-alone (discrete) devices, and therefore is expensive.

Thus, an encapsulated MEMS device and a method to form an encapsulated MEMS device are described herein.

BRIEF DESCRIPTION OF THE DRAWINGS

FIG. 1A illustrates a side-on cross-sectional view representing a MEMS structure having an encapsulated MEMS device, in accordance with an embodiment of the present invention.

FIG. 1B illustrates a top-down cross-sectional view representing a MEMS structure having an encapsulated MEMS device, taken along axis a-a' from FIG. 1A, in accordance with an embodiment of the present invention.

FIG. 1C illustrates a top-down cross-sectional view representing a MEMS structure having an encapsulated MEMS device, taken along axis b-b' from FIG. 1A, in accordance with an embodiment of the present invention.

DETAILED DESCRIPTION

Figure 2:
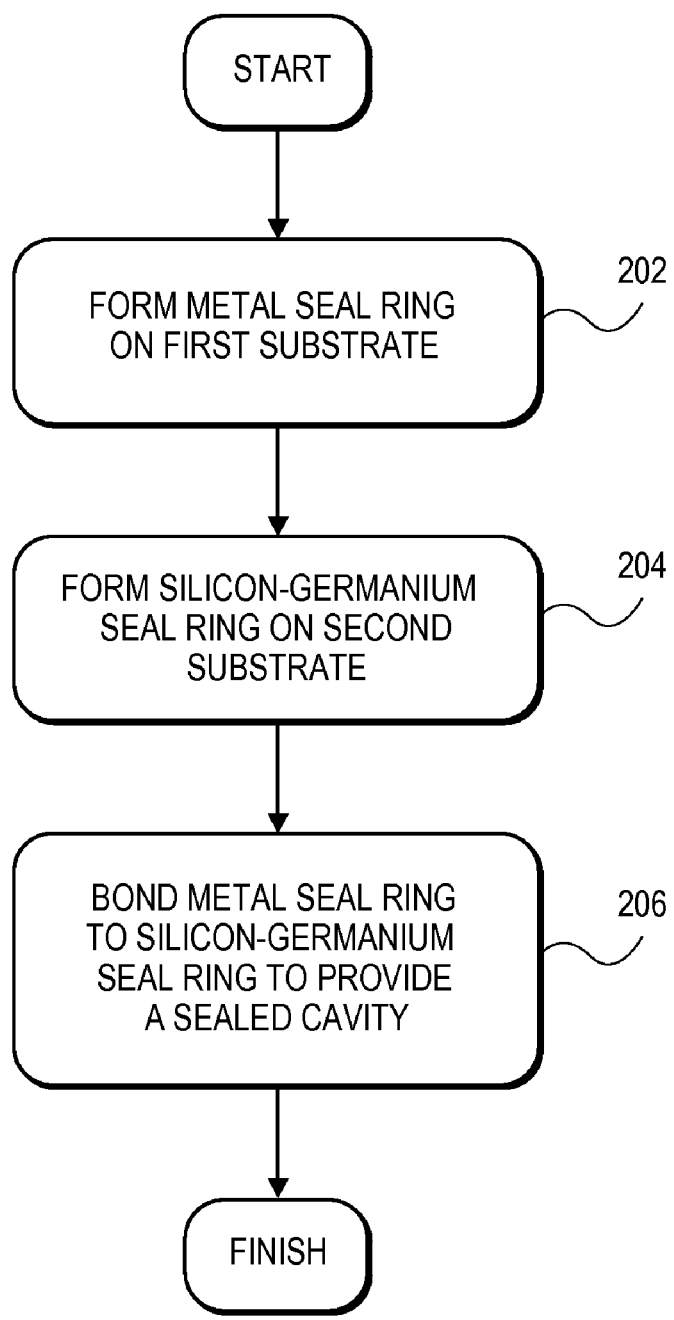
FIG. 2 is a Flowchart representing steps used in a method to form a MEMS structure having an encapsulated MEMS device, in accordance with an embodiment of the present invention.

An encapsulated MEMS device and a method to form an encapsulated MEMS device are described. In the following description, numerous specific details are set forth, such as material compositions and chemical regimes, in order to provide a thorough understanding of the present invention. It will be apparent to one skilled in the art that the present invention may be practiced without these specific details. In other instances, well-known features such as lithographic parameters and patterning procedures are not described in detail in order to not unnecessarily obscure the present invention. Furthermore, it is to be understood that the various embodiments shown in the Figures are illustrative representations and are not necessarily drawn to scale.

Disclosed herein are an encapsulated MEMS device and a method to form an encapsulated MEMS device. An apparatus may include a first substrate having a silicon-germanium seal ring disposed thereon and a second substrate having a metal seal ring disposed thereon. In one embodiment, the metal seal ring is aligned with and bonded to the silicon-germanium seal ring to provide a sealed cavity. A MEMS device may be housed in the sealed cavity. In a specific embodiment, the metal seal ring is eutectically bonded to the silicon-germanium seal ring to provide the sealed cavity. A method may include forming a silicon-germanium seal ring on a first substrate and forming a metal seal ring on a second substrate. In one embodiment, the metal seal ring is bonded to the silicon-germanium seal ring to form a bond and to provide a sealed cavity that houses a MEMS device. In a specific embodiment, the metal seal ring is bonded to the silicon-germanium seal ring to form a eutectic bond between the metal seal ring and the silicon-germanium seal ring.

Bonding a silicon-germanium seal ring to a metal seal ring to form a sealed cavity for a MEMS device may enable the fabrication of a low-contaminant cavity at a relatively low process temperature. For example, in accordance with an embodiment of the present invention, a first wafer is provided which houses a MEMS device inside of the region enclosed by a silicon-germanium seal ring. The first wafer is bonded to a second wafer having a metal seal ring disposed thereon. In one embodiment, the first wafer is bonded to the second wafer via the silicon-germanium seal ring and the metal seal ring, respectively. The metal seal ring may be composed of gold and may form a eutectic bond with the silicon-germanium seal ring at a process temperature less than 400 degrees Celsius. In the case that the bond provides a hermetic seal, a sealed cavity (the space enclosed inside of the bonded seal rings) may thus be fabricated at a low process temperature. Thus, in one embodiment, the MEMS device on the first wafer is housed in a sealed cavity.

Additionally, in accordance with an embodiment of the present invention, a metal shielding layer can be included on the second wafer, inside of the region enclosed by the metal seal ring. Upon bonding of the first and second wafers, the metal shielding layer is included in the sealed cavity and is provided to mitigate electro-magnetic interference of a device housed in the sealed cavity. Furthermore, in one embodiment, the metal shielding layer can act as a getter layer to facilitate the removal or consumption of impurities that may be trapped in the sealed cavity. Finally, in accordance with an embodiment of the present invention, die singulation, using a set of windows formed in one of the wafers, can be carried out to provide isolated die from the bonded wafers. Such a die singulation approach may minimize the number of masks required for wafer alignment and bonding when isolating a plurality of individual die.

In an aspect of the present invention, a MEMS structure includes an encapsulated MEMS device. FIGS. 1A-1C illustrate cross-sectional views representing a MEMS structure having an encapsulated MEMS device, in accordance with an embodiment of the present invention.

Referring to FIG. 1A, which represents a side-on cross-sectional view, a MEMS structure 100 includes a MEMS device 102. A first (device) substrate 104 has a silicon-germanium seal ring 106 disposed thereon. A second (cap) substrate 108 has a metal seal ring 110 disposed thereon. In accordance with an embodiment of the present invention, metal seal ring 110 is aligned with and bonded to silicon-germanium seal ring 106 and, in a specific embodiment, metal seal ring 110 is eutectically bonded to silicon-germanium seal ring 106. Thus, a sealed cavity 112 may be provided. In one embodiment, sealed cavity 112 houses MEMS device 102, as depicted in FIG. 1A. A metal shielding layer 114 is disposed on a surface of cap substrate 108 and is included inside of sealed cavity 112. Contact pads 116 are included on device substrate 104, on the outside of sealed cavity 112. Metal seal ring 110 may be included in a metal seal ring stack 113 including a seed layer 118 and a dielectric layer 120, both of which are depicted in FIG. 1A.

Sealed cavity 112 may seal off exposure of MEMS device 102 to the environment outside of sealed cavity 112. In accordance with an embodiment of the present invention, sealed cavity is essentially free of contaminants, such as organic residues or moisture. In one embodiment, sealed cavity 112 is hermetically sealed from the environment outside of sealed cavity 112. In a specific embodiment, the pressure inside of sealed cavity 112 is less than the pressure outside of sealed cavity 112. In a particular embodiment, the pressure inside of sealed cavity 112 is less than approximately 100 mTorr and the pressure outside of sealed cavity 112 is approximately 1 atmosphere. In another specific embodiment, the pressure inside of sealed cavity 112 is approximately the same as the pressure outside of sealed cavity 112. In another specific embodiment, the pressure inside of sealed cavity 112 is greater than the pressure outside of sealed cavity 112. In a particular embodiment, sealed cavity 112 has a height (taken from the top surface of device substrate 104 to the surface of cap substrate 108) approximately in the range of 60-100 microns.

Referring to FIG. 1B, which represents a top-down cross-sectional view taken along axis a-a' from FIG. 1A, MEMS device 102 is included inside of the region enclosed by silicon-germanium seal ring 106. Meanwhile, contact pads 116 are included on device substrate 104, outside of the region enclosed by silicon-germanium seal ring 106.

MEMS device 102 may be any device that falls within the scope of MEMS technologies. For example, MEMS device 102 may be any mechanical and electronic structure having a critical dimension of less than approximately 250 microns and fabricated above a substrate using lithography, deposition, and etching processes. In accordance with an embodiment of the present invention, MEMS device 102 is a device such as, but not limited to, a resonator (such as an oscillator), a temperature sensor, a pressure sensor or an inertial sensor (such as an accelerometer or a gyroscope). MEMS device 102 may have a suspended portion, as depicted in FIG. 1A. In one embodiment, the suspended portion of MEMS device 102 is a suspended feature having a resonant frequency. For example, in an embodiment, the suspended portion is a feature such as, but not limited to, a beam, a plate, a cantilever arm or a tuning fork. In a specific embodiment, MEMS device 102 includes a resonating feature 122 flanked by a driver electrode 124 and a sensor electrode 126, as depicted in FIG. 1B.

MEMS device 102 may be formed from a material suitable to withstand a MEMS fabrication process. For example, in accordance with an embodiment of the present invention, MEMS device 102 is composed of a material such as, but not limited to, a semiconductor, in insulator or a conductor. In one embodiment, MEMS device 102 is composed of a semiconductor material such as, but not limited to, silicon, germanium, silicon-germanium, carbon-doped silicon, carbon-doped silicon-germanium or a III-V material. The semiconductor material may also be composed of dopant impurity atoms. For example, in a specific embodiment, MEMS device 102 is composed of polycrystalline silicon-germanium with a germanium atomic concentration approximately in the range of 50-70% and boron dopant impurity atoms with a total atomic concentration approximately in the range of $1\times10^{18}$-$5\times10^{20}$ atoms/cm$^3$. Furthermore, MEMS device 102 may be composed of a semiconductor material that is formed by a relatively low temperature process. In one embodiment, MEMS device 102 is composed of a semiconductor material formed at a temperature less than approximately 450° C. In one alternative embodiment, MEMS device 102 is composed of an insulating material such as, but not limited to, silicon dioxide, silicon nitride, silicon oxy-nitride or a high-K dielectric material. In another alternative embodiment, MEMS device 102 is composed of a conductor and is formed from a material such as, but not limited to, copper, aluminum, a metal alloy or a metal silicide.

Silicon-germanium seal ring 106 may be composed of any ratio of silicon and germanium suitable for bonding and, in a specific embodiment, suitable for eutectic bonding. In accordance with an embodiment of the present invention, silicon-germanium seal ring 106 is composed of essentially the same material as that of MEMS device 102. Thus, in one embodiment, silicon-germanium seal ring 106 is composed of polycrystalline silicon-germanium with a germanium atomic concentration approximately in the range of 50-70% and boron dopant impurity atoms with a total atomic concentration approximately in the range of $1\times10^{18}$-$5\times10^{20}$ atoms/cm$^3$. The width of silicon-germanium seal ring 106 may be any width suitable to withstand bonding with metal seal ring 110. In a specific embodiment, the width of silicon-germanium seal ring 106 is a width suitable to withstand eutectic bonding with metal seal ring 110 without permitting metal seal ring 110 to flow to the sides of silicon-germanium seal ring 106 during the eutectic bonding process. In an embodiment, the width of the wall (x) of silicon-germanium seal ring 106 is approximately in the range of 50-70 microns. The height of silicon-germanium seal ring 106 (as measured from the top surface of device substrate 104) may be approximately the same as the height of MEMS device 102. In a specific embodiment, the height of silicon-germanium seal ring 106 is approximately in the range of 0.5-10 microns. In an embodiment, more than one MEMS device is included inside of the region enclosed by silicon-germanium seal ring 106.

Contact pads 116 may be composed of any conductive material suitable to withstand a MEMS fabrication process. For example, in accordance with an embodiment of the present invention, contact pads 116 are composed of a material such as, but not limited to, a semiconductor material heavily doped with charge-carrier impurity atoms or a conductor. In one embodiment, contact pads 116 are composed of a heavily doped semiconductor material such as, but not limited to, silicon, germanium, silicon-germanium, carbon-doped silicon or a III-V material. In a specific embodiment, contact pads 116 are composed of a group IV material heavily doped with charge-carrier impurity atoms such as, but not limited to, boron, indium, phosphorus, arsenic or antimony. For example, in a particular embodiment, contact pads 116 are composed of polycrystalline silicon-germanium with a germanium atomic concentration approximately in the range of 55-95% and boron dopant impurity atoms with a total atomic concentration approximately in the range of $1\times10^{20}$-$5\times10^{22}$ atoms/cm$^3$. In another specific embodiment, contact pads 116 are composed of a group III-V material heavily doped with charge-carrier impurity atoms such as, but not limited to, carbon, silicon, germanium, oxygen, sulfur, selenium or tellurium. In one embodiment, contact pads 116 are composed of a conductor and are formed from a material such as, but not limited to, copper, aluminum, a metal alloy or a metal silicide. A low temperature process may be used to form contact pads 116. Thus, in accordance with an embodiment of the present invention, contact pads 116 are composed of a material formed at a temperature less than approximately 450° C. Furthermore, contact pads 116 may be composed of a material having a low resistivity. For example, in one embodiment, contact pads 116 are composed of a material having a volume resistivity less than approximately $1\times10^{-5}$ ohms·cm.

Device substrate 104 may be composed of any material suitable to withstand a MEMS fabrication process and to provide structural integrity for a MEMS structure having a suspended member. In an embodiment, device substrate 104 is composed of group IV-based materials such as, but not limited to, crystalline silicon, germanium or silicon-germanium. In another embodiment, device substrate 104 is composed of a III-V material. Device substrate 104 may also include an insulating layer. In one embodiment, the insulating layer is composed of a material such as, but not limited to, silicon dioxide, silicon nitride, silicon oxy-nitride or a high-k dielectric layer. Alternatively, device substrate 104 may be composed essentially of an insulator material. In one embodiment, device substrate 104 is composed essentially of a material such as, but not limited to, glass, quartz or sapphire. Device substrate 104 may further incorporate an integrated circuit. For example, in accordance with an embodiment of the present invention, device substrate 104 includes a plurality of interconnect structures connecting a plurality of micro-electronic devices, both of which are disposed underneath MEMS device 102. In one embodiment, the plurality of micro-electronic devices is a plurality of N-type and P-type transistors and the plurality of interconnect structures is a plurality of metal interconnects that tie the plurality of N-type and P-type transistors into an integrated circuit. Device substrate 104 may further include conductive electrodes that contact underlying interconnect structures. For example, in one embodiment, device substrate 104 includes a plug or via in contact with contact pads 116.

Referring to FIG. 1C, which represents a top-down cross-sectional view taken along axis b-b' from FIG. 1A, metal shielding layer 114 is included inside of the region enclosed by metal seal ring stack 113. Metal shielding layer 114 may be composed of a material suitable to protect the performance of a device from electro-magnetic interference. In one embodiment, metal shielding layer is composed of a material such as, but not limited to, titanium, tungsten, chromium or alloys thereof. In accordance with an embodiment of the present invention, metal shielding layer also acts as a getter layer and is provided for removing impurities such as, but not limited to, organic residues or moisture, both of which may be contaminants or by-products in the fabrication and encapsulation of MEMS device 102. Cap substrate 108, on which metal shielding layer 114 is disposed, may be composed of any material suitable to support metal seal ring stack 113 and suitable to withstand a subsequent thinning process. In one embodiment, cap substrate 108 is composed of a material such as, but not limited to, silicon, glass, quartz or a III-V compound material.

Metal seal ring 110 may be composed of any material suitable for bonding with silicon-germanium ring 106. In accordance with an embodiment of the present invention, metal seal ring 110 forms a eutectic bond with silicon-germanium ring 106 and, therefore, the metal-silicon-germanium alloy formed therefrom is a eutectic alloy having a sharp melting point. In one embodiment, metal seal ring 110 is composed of a metal such as, but not limited to, gold, aluminum or alloys thereof. The width of metal seal ring 110 may be any width suitable to withstand bonding with silicon-germanium ring 106. In a specific embodiment, the width of metal seal ring 110 may be a width suitable to withstand eutectic bonding with silicon-germanium ring 106 without flowing from the top to the sides of silicon-germanium seal ring 106 during the eutectic bonding process. In an embodiment, the width of the wall (y) of metal seal ring 110 is smaller than the width of the wall (x) of silicon-germanium seal ring 106. In a specific embodiment, the width of the wall (y) of metal seal ring 110 is approximately in the range of 20-40 microns.

In accordance with an embodiment of the present invention, metal seal ring 110 is disposed on seed layer 118 and dielectric layer 120 to form metal seal ring stack 113, as depicted in FIG. 1A. The height of metal seal ring stack 113 (as measured, e.g., from the surface of cap substrate 108 to the surface of metal seal ring 110) may be a height suitable to withstand a subsequent die singulation process and to permit MEMS device 102 to move freely. In a specific embodiment, the combined height of metal seal ring stack 113 and silicon-germanium seal ring 106 is approximately in the range of 60-100 microns. In an embodiment, but not depicted, a MEMS device is included inside of the region enclosed by metal seal ring 110. In an alternative embodiment, metal seal ring 110 is disposed directly on cap substrate 108.

In an aspect of the present invention, a MEMS structure may be fabricated to include an encapsulated MEMS device. FIG. 2 is a Flowchart 200 representing steps used in a method to form a MEMS structure having an encapsulated MEMS device, in accordance with an embodiment of the present invention. FIGS. 3A-3M illustrate cross-sectional views representing a series of steps for fabricating a MEMS structure having an encapsulated MEMS device, in accordance with an embodiment of the present invention.

Referring to operation 202 from Flowchart 200, and corresponding with FIGS. 3A-3D, a first (metal) seal ring is formed on the top surface of a first (cap) substrate. Specifically, referring to FIG. 3A, cap substrate 308 is provided. Cap substrate 308 may be composed of a material described in association with cap substrate 108 from FIGS. 1A-1C. In one embodiment, cap substrate 308 has a thickness approximately in the range of 700-800 microns. A dielectric layer 301 may be disposed on cap substrate 308 to provide a diffusion barrier for a subsequently formed sealed cavity. In one embodiment, dielectric layer 301 is composed of silicon dioxide formed either by chemical vapor deposition or thermal heating of a silicon substrate and has a thickness approximately in the range of 100-500 nanometers. A seed layer 303 may be disposed on dielectric layer 301 to act as a glue layer during subsequent fabrication of a metal seal ring. In one embodiment, seed layer 303 is composed of a material such as, but not limited to, titanium, chromium, gold, tungsten, nickel or alloys thereof. In a specific embodiment, seed layer 303 is formed by chemical vapor deposition or physical vapor deposition and has a thickness approximately in the range of 10-200 nanometers.

Figure 3A:
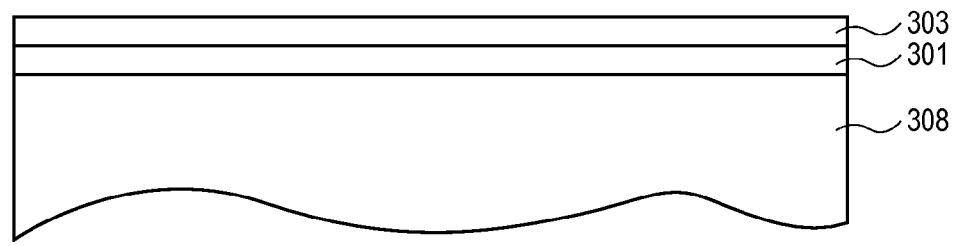
FIGS. 3A-3M illustrate cross-sectional views representing a series of steps for fabricating a MEMS structure having an encapsulated MEMS device, in accordance with an embodiment of the present invention.
Figure 3B:
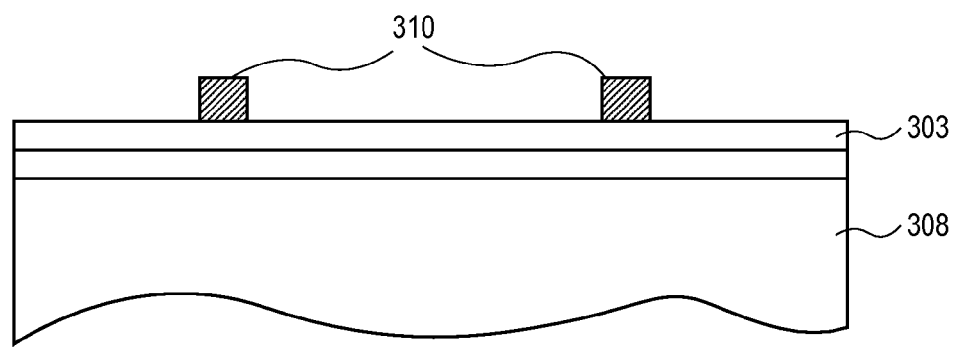
Figure 3B:
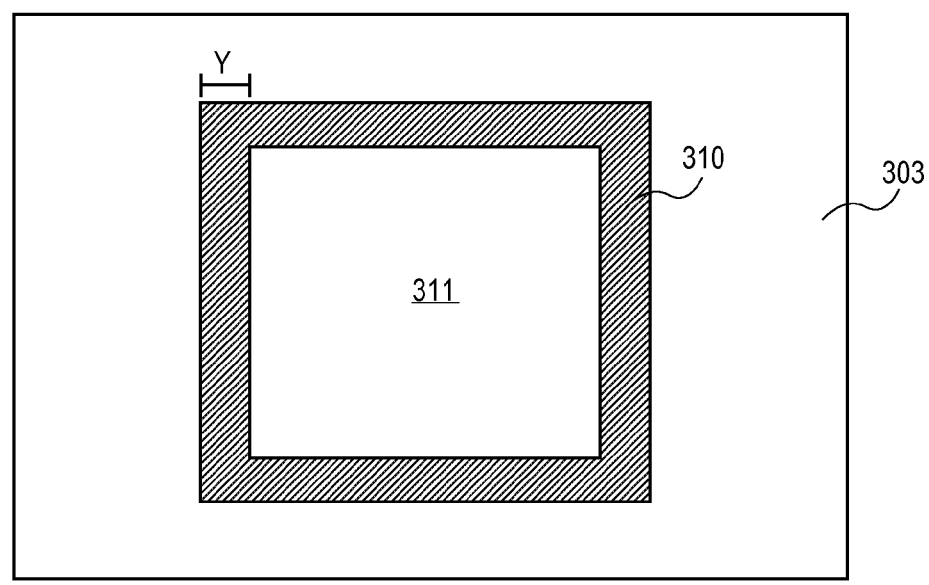

Referring to FIGS. 3B and 3B' (top-down view of FIG. 3B), a metal seal ring 310 is formed above cap substrate 308. In accordance with an embodiment of the present invention, metal seal ring 310 is formed on seed layer 303, as depicted in FIGS. 3B and 3B'. Metal seal ring 310 may be composed of a material described in association with metal seal ring 110 from FIGS. 1A-1C. In one embodiment, metal seal ring 310 is formed first by blanket deposition by a technique such as, but not limited to, plating, evaporation, sputter deposition or vapor deposition and, subsequently, lithography and etch patterning. In another embodiment, metal seal ring 310 is formed directly, i.e. without the need for subsequent lithographic patterning, by a technique such as, but not limited to, lift-off, selective plating or screen printing. In a specific embodiment, metal ring 310 is formed to a thickness approximately in the range of 0.5-10 microns. The walls of metal seal ring 310 may have a width (y) suitable for subsequent bonding to another seal ring. In accordance with an embodiment of the present invention, the walls of metal seal ring 310 have a width (y) suitable for subsequent eutectic bonding to another seal ring without overflowing the surface of that other seal ring. Accordingly, in one embodiment, the width of metal seal ring 310 as formed is predetermined to allow some room for expansion and/or misalignment during a subsequent eutectic bonding process. In a specific embodiment, the as formed width (y) of the walls of metal seal ring 310 is approximately in the range of 20-40 microns. The region 311 enclosed by metal seal ring 310 may be any dimension suitable for encapsulating a MEMS device or a plurality of MEMS devices.

Figure 3C:
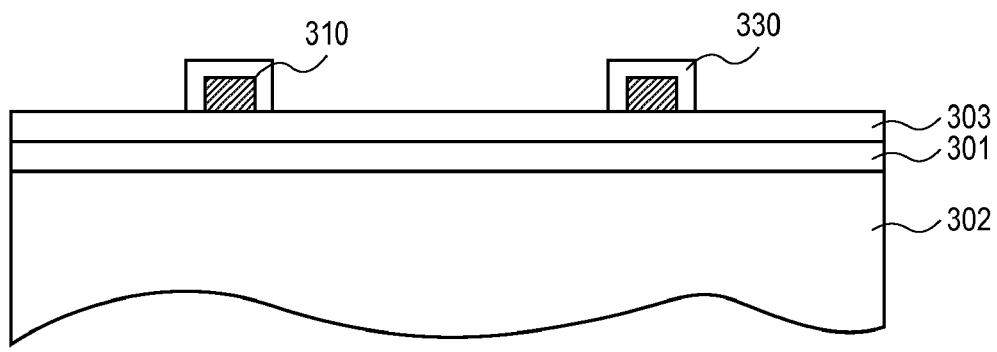
Figure 3D:
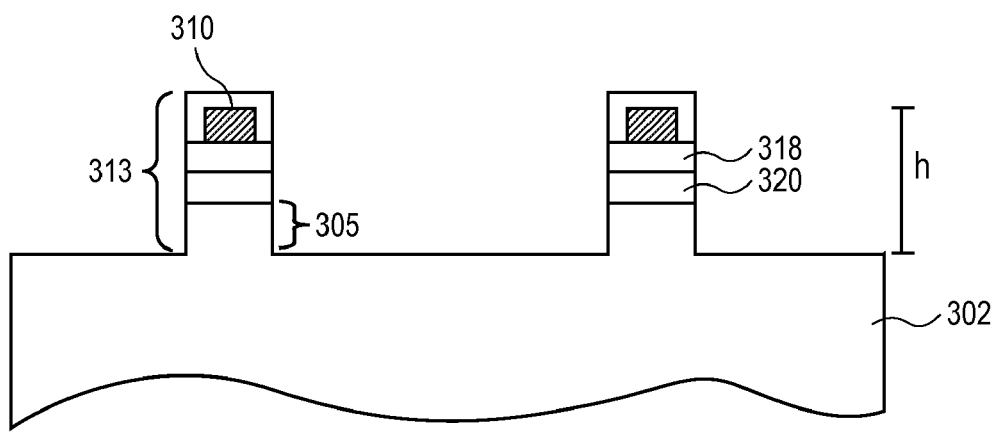

Referring to FIGS. 3C and 3D, the height (h) of metal seal ring 310 may be extended to include the thicknesses of seed layer 303, dielectric layer 301 and a recessed portion 305 of cap substrate 302. Specifically, referring to FIG. 3C, a mask layer 330 is patterned to cover metal seal ring 310. In one embodiment, mask layer 330 is composed of photo-resist and is patterned by a lithography and etch process. Next, referring to FIG. 3D, seed layer 303, dielectric layer 301 and cap substrate 302 are patterned to form patterned seed layer 318, patterned dielectric layer 320, and recessed portion 305 in cap substrate 302. In one embodiment, seed layer 303, dielectric layer 301 and cap substrate 302 are patterned by a technique such as, but not limited to, reactive ion etching or wet etching, during which metal ring 310 is protected by mask layer 330.

Thus, a metal seal ring stack 313 may be formed. Metal seal ring stack 313 may be formed to a height (h) suitable to provide a cavity for a subsequently encapsulated MEMS device and to accommodate a sawing process during die singulation. In one embodiment, the height (h) of metal seal ring stack 313 is greater than approximately 60 microns.

Figure 3E:
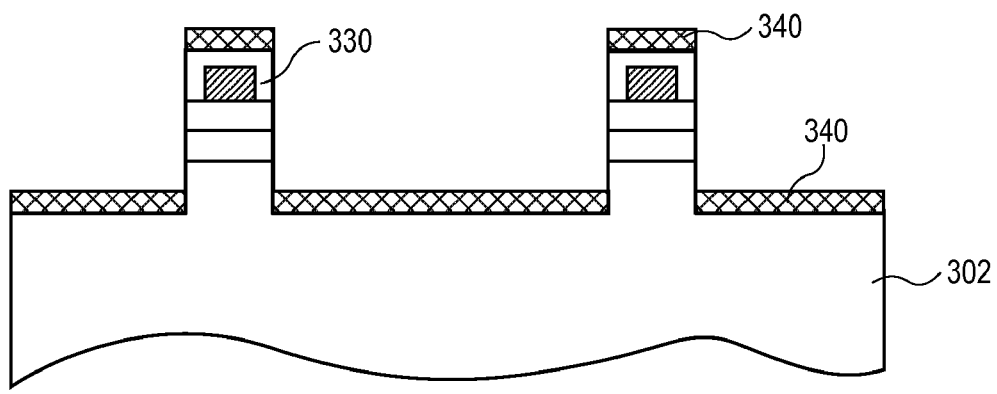
Figure 3F:
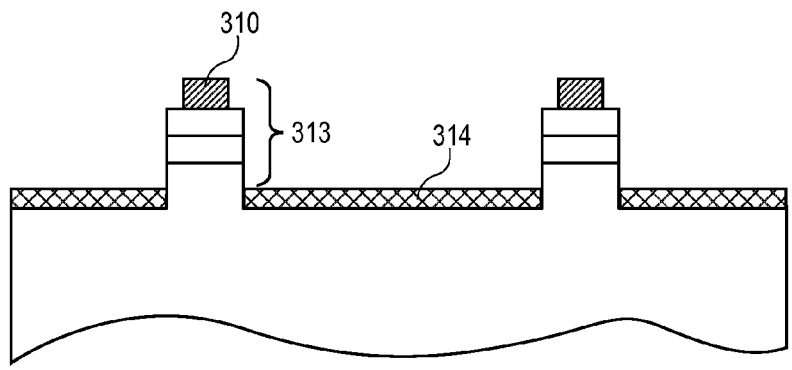

Referring to FIGS. 3E and 3F, a metal shielding layer may be formed above cap substrate 302, inside of the region enclosed by said metal seal ring stack 313. Specifically, referring to FIG. 3E, a metal layer 340 is deposited above the exposed surface of cap substrate 302 and above mask layer 330. Metal layer 340 may be composed of a material described in association with metal shielding layer 114 from FIGS. 1A-1C. In one embodiment, metal layer 340 is formed by a technique such as, but not limited to, sputtering, evaporation or vapor deposition and is formed to a thickness approximately in the range of 50-1000 nanometers. Referring to FIG. 3F, the portions of metal layer 340 above metal seal ring stack 313 are removed to provide a metal shielding layer 314. In accordance with an embodiment of the present invention, the portions of metal layer 340 above metal seal ring stack 313 are removed by lifting-off mask 330. In one embodiment, a wet etch lift-off process is used to remove mask 330 and to provide metal shielding layer 314.

Figure 3G:
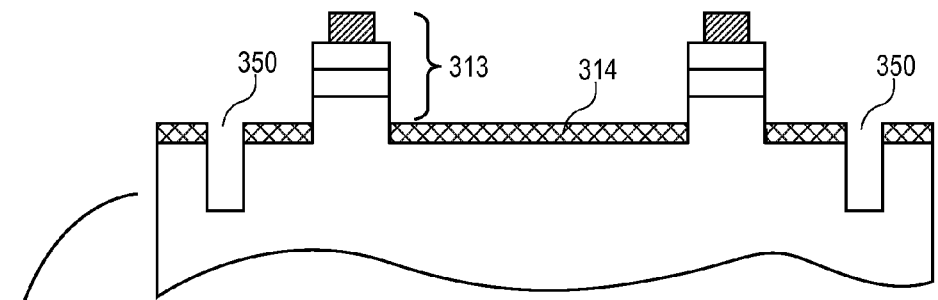

Upon formation of metal shielding layer 314 and re-exposure of metal seal ring 310 of metal seal ring stack 313, the first step in a die singulation approach may be carried out. Referring to FIG. 3G, a set of trenches 350 is formed in the top surface of cap substrate 302, outside of the region enclosed by metal seal ring stack 313. The set of trenches 350 may ultimately be used to provide alignment marks for die singulation. The set of trenches 350 may have a depth suitable for subsequently forming a set of windows in cap substrate 302. For example, in accordance with an embodiment of the present invention, cap substrate 302 has a thickness in the range of 700-800 microns and each of the trenches of the set of trenches 350 is formed to a depth approximately in the range of 100-400 microns. The width of each of the trenches of the set of trenches 350 may be selected to optimize a subsequent alignment process. In one embodiment, the width of each of the trenches of the set of trenches 350 is approximately in the range of 20-100 microns. In a specific embodiment, the set of trenches 350 is formed by a technique such as, but not limited to, laser cutting, deep reactive ion etching or partial dicing.

Figure 3H:
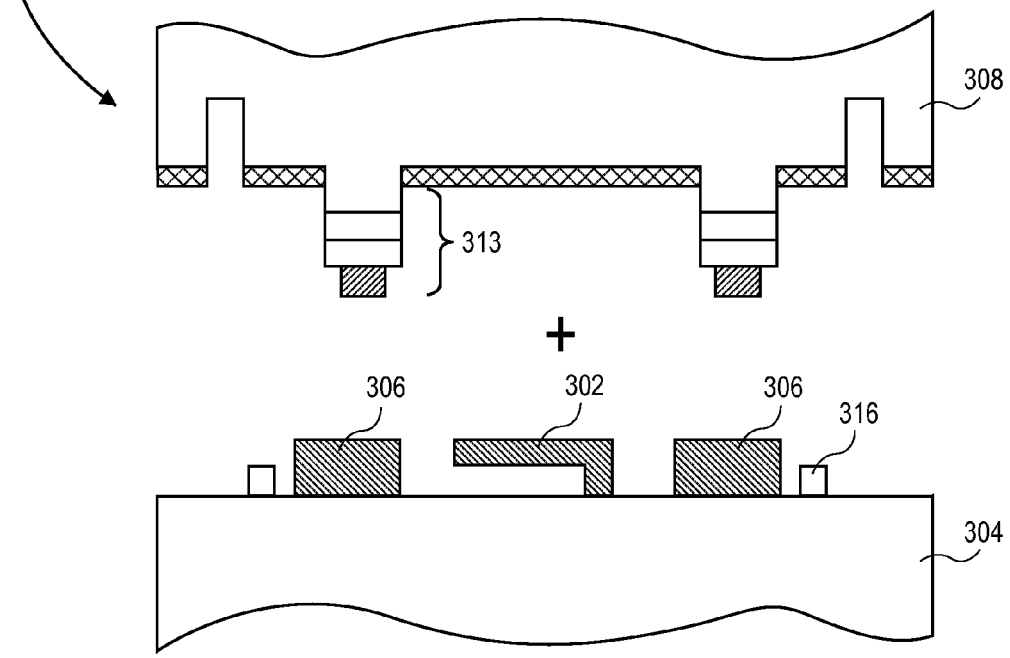

Referring to operation 204 from Flowchart 200, and corresponding with FIG. 3H, a second (device) substrate 304 is provided having a second seal ring 306 disposed thereon. A MEMS device 302 and contact pads 316 may also be disposed on device substrate 302, as depicted in FIG. 3H. Device substrate 304, MEMS device 302 and contact pads 316 may be composed of a material and may have a function described in association with device substrate 104, MEMS device 102 and contact pads 116 from FIGS. 1A-1C. In accordance with an embodiment of the present invention, second seal ring 306 is composed of silicon-germanium. In one embodiment, second seal ring 306 is pre-bond aligned with metal seal ring stack 313 on cap substrate 308, as depicted in FIG. 3H.

Figure 3I:
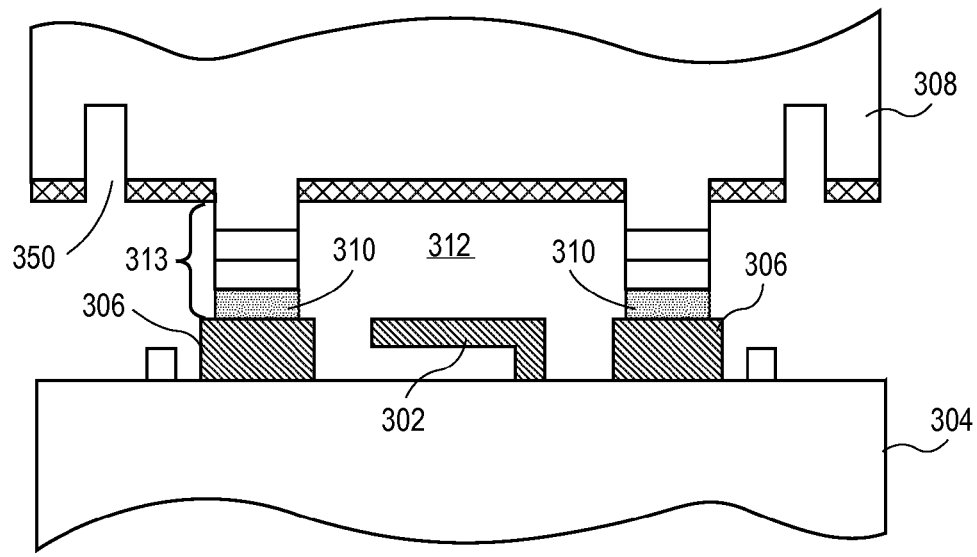

Referring to operation 206 from Flowchart 200, and corresponding with FIG. 3I, second seal ring 306 is bonded to metal seal ring 310 to provide a sealed cavity 312 that houses MEMS device 302. In accordance with an embodiment of the present invention, second seal ring 306 is bonded to metal seal ring 310 to provide a eutectic bond between the two seal rings. In one embodiment, metal seal ring 310 is composed of gold, second seal ring 306 is composed of silicon-germanium and a eutectic bond is formed between the two seal rings at a temperature less than approximately 400 degrees Celsius. In a particular embodiment, metal seal ring 310 is composed of gold, second seal ring 306 is composed of silicon-germanium and a eutectic bond is formed between the two seal rings at a temperature of approximately 360 degrees Celsius. In another embodiment, metal seal ring 310 is composed of aluminum, second seal ring 306 is composed of silicon-germanium and a eutectic bond is formed between the two seal rings at a temperature less than approximately 450 degrees Celsius. In a specific embodiment, an isopropyl alcohol vapor clean process is carried out on both cap substrate 308 and device substrate 304 immediately prior to bonding. In an embodiment, cap substrate 308 and device substrate 304 are aligned by optical key-to-key alignment.

In an alternative embodiment of the present invention, second seal ring 306 is bonded to a glass seal ring, instead of a metal seal ring, to provide a bond between the two seal rings. In one such embodiment, the bond is a fusion bond and is formed by annealing at a temperature greater than approximately 600 degrees Celsius or at a temperature of approximately 400 degrees Celsius if the annealing is carried out in conjunction with a surface activation process step. In another such embodiment, the bond is an anodic bond and is formed by annealing at a temperature approximately in the range of 200-400 degrees Celsius while the seal rings are grounded with an applied voltage approximately in the range of 500-2000 Volts. In yet another such embodiment, the bond is a glass frit bond and is formed by using a thin glass layer and annealing at a temperature of approximately 415 degrees Celsius.

As depicted in FIG. 3I, and in accordance with an embodiment of the present invention, metal seal ring 310 is narrower than second seal ring 306. In fact, in one embodiment, metal seal ring 310 has a starting width narrower than the rest of metal seal ring stack 313, as depicted in FIGS. 3F-3H. The width of metal seal ring 310 may be initially selected to accommodate expansion during eutectic bonding with second seal ring 306 and to accommodate any misalignment when bonding second seal ring 306 to metal seal ring stack 313. In one embodiment, any expansion or misalignment is accommodated by a wider second seal ring 306 to prevent the migration or flow of metal to a location other than the top surface of second seal ring 306. In a specific embodiment, the use of a wider second seal ring prevents metal contamination of MEMS device 302. In a particular embodiment, the width of metal seal ring 310 is initially formed to be narrower than the rest of metal seal ring stack 313, but following bonding with second seal ring 306, metal seal ring 310 has a width approximately equal to the width of metal seal ring stack 313, as depicted in FIGS. 3F-3I. In that embodiment, the final width of metal seal ring 310 remains smaller than the width second seal ring 306.

The environment inside of sealed cavity 312 may be selected according to specific MEMS applications. For example, in accordance with one embodiment of the present invention, metal seal ring 310 is bonded to second seal ring 306 in a reduced pressure atmosphere, i.e. an atmosphere having a pressure less than the pressure of the environment in which a die incorporating MEMS device 302 will be used. In another embodiment, metal seal ring 310 is bonded to second seal ring 306 in an ambient pressure atmosphere, i.e. an atmosphere having a pressure similar to the pressure of the environment in which a die incorporating MEMS device 302 will be used. In another embodiment, metal seal ring 310 is bonded to second seal ring 306 in an increased pressure atmosphere, i.e. an atmosphere having a pressure greater than the pressure of the environment in which a die incorporating MEMS device 302 will be used.

Figure 3J:
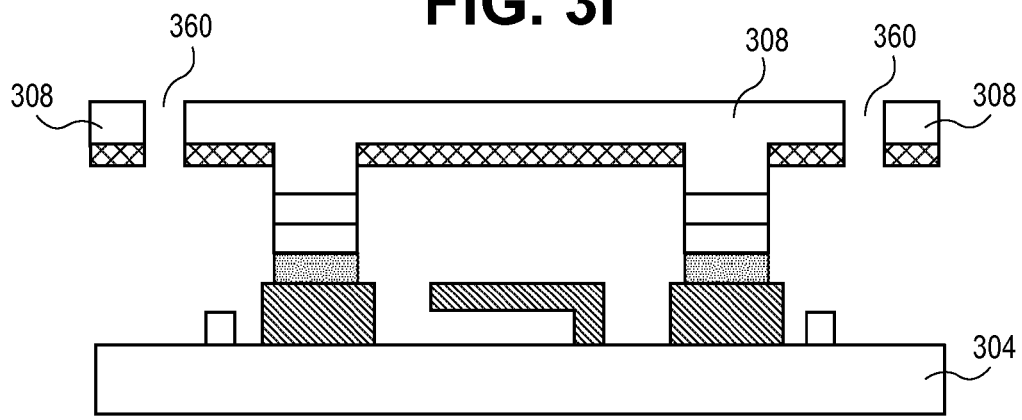

Referring to FIG. 3J, a next step in a die singulation approach is carried out. Both cap substrate 308 and device substrate 304 are thinned. In one embodiment, both cap substrate 308 and device substrate 304 are thinned to a thickness approximately in the range of 100-200 microns. In a specific embodiment, cap substrate 308 and device substrate 304 are thinned by grinding the bottom surface of each substrate. In accordance with an embodiment of the present invention, cap substrate 308 is sufficiently thinned to expose the set of trenches 350, providing a set of windows 360 in cap substrate 308.

Figure 3K:
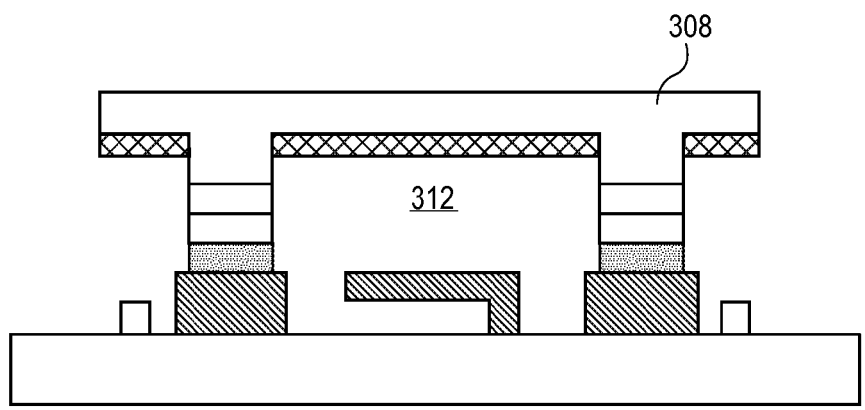
Figure 3L:
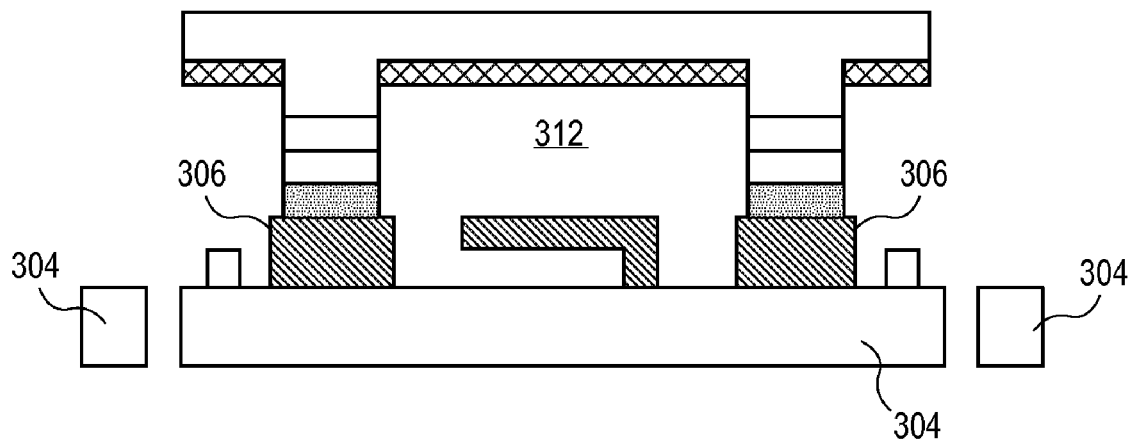
Figure 3M:
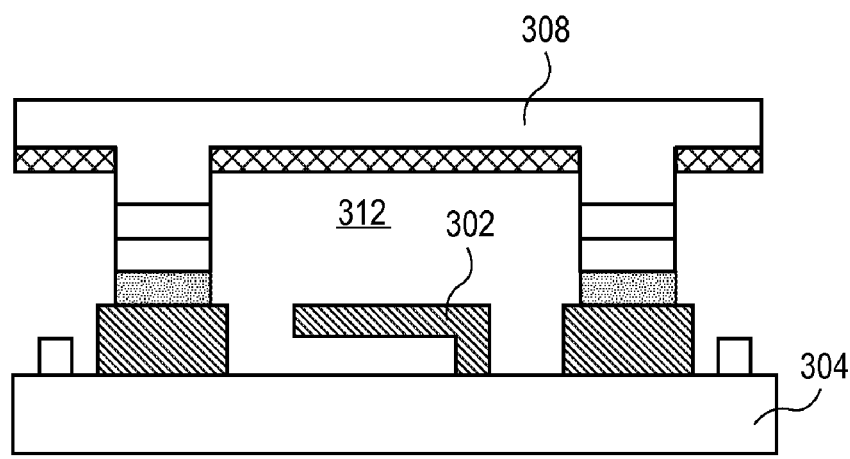

Referring to FIG. 3K, cap substrate 308 is diced along the set of windows 360, outside of sealed cavity 312. In accordance with an embodiment of the present invention, the set of windows 360 is used as a set of alignment marks for the dicing of cap substrate 308. In one embodiment, by using the set of windows 360 as a set of alignment marks for the dicing, the overall bonding process requires one less mask step for alignment considerations. In a specific embodiment, cap substrate 308 is diced by sawing. Finally, referring to FIG. 3L, device substrate 304 is diced outside of the region enclosed by said second seal ring 306, i.e. outside of sealed cavity 312. Thus, referring to FIG. 3M, a singulated die having a diced cap substrate 308 bonded to a diced device substrate 304 is provided to encapsulate MEMS device 302 in sealed cavity 312.

Figure 4:
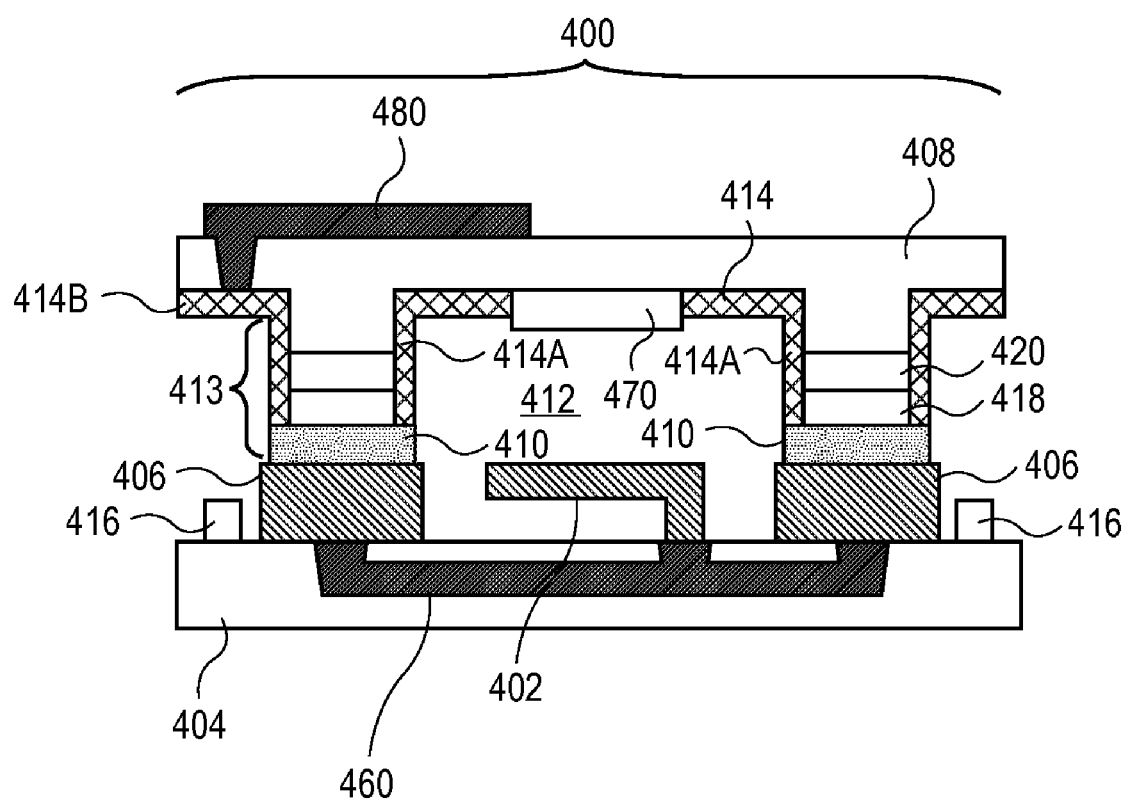
FIG. 4 illustrates a side-on cross-sectional view representing a MEMS structure having an encapsulated MEMS device, wherein a cap substrate is electrically coupled with a device substrate, in accordance with an embodiment of the present invention.

In another aspect of the present invention, a metal layer housed in a sealed cavity may be used to electrically couple a cap substrate and a device substrate of a MEMS structure. FIG. 4 illustrates a side-on cross-sectional view representing a MEMS structure having an encapsulated MEMS device, wherein a cap substrate is electrically coupled with a device substrate, in accordance with an embodiment of the present invention.

Referring to FIG. 4, a MEMS structure 400 includes a MEMS device 402. A first (device) substrate 404 has a silicon-germanium seal ring 406 disposed thereon. A second (cap) substrate 408 has a metal seal ring 410 disposed thereon. In accordance with an embodiment of the present invention, metal seal ring 410 is aligned with and bonded to silicon-germanium seal ring 406 and, in a specific embodiment, metal seal ring 410 is eutectically bonded to silicon-germanium seal ring 406. Thus, a sealed cavity 412 is provided. In one embodiment, sealed cavity 412 houses MEMS device 402, as depicted in FIG. 4. Contact pads 416 may be included on device substrate 404, on the outside of sealed cavity 412. Metal seal ring 410 may be included in a metal seal ring stack 413 including a seed layer 418 and a dielectric layer 420, both of which are depicted in FIG. 4.

A metal shielding layer 414 is disposed on a surface of cap substrate 408 and is included inside of sealed cavity 412. In accordance with an embodiment of the present invention, metal shielding layer 414 extends along the sidewalls of metal seal ring stack 413 to electrically couple cap substrate 408 with device substrate 404 via metal seal ring 410. In one embodiment, the intra-cavity portion 414A of metal shielding layer 414 is electrically coupled to MEMS device 402 via metal seal ring 410, silicon-germanium seal ring 406 and an interconnect 460 formed in device substrate 404, as depicted in FIG. 4. In a specific embodiment, a thin film battery 470 is housed in sealed cavity 412 on the side of cap substrate 408. In that embodiment, thin film battery 470 is electrically coupled to MEMS device 402 via portions of metal shielding layer 414 which act as a portion of the terminals for thin film battery 470. Other functionality may also be built in to cap substrate 408. For example, in one embodiment, the extracavity portion 414B of metal shielding layer 414 is electrically coupled to device substrate 404 via metal seal ring 410 and silicon-germanium seal ring 406. In a specific embodiment, a grounding interconnect 480 is provided for grounding device substrate 404, and in a particular embodiment for grounding MEMS device 402, as depicted in FIG. 4. In accordance with yet another embodiment of the present invention, cap substrate 408 includes circuitry disposed on or within its substrate body. The circuitry of cap substrate 408 may be coupled to various circuitry disposed on or within the substrate body of device substrate 404, including circuitry connected to MEMS device 402.

Figure 5:
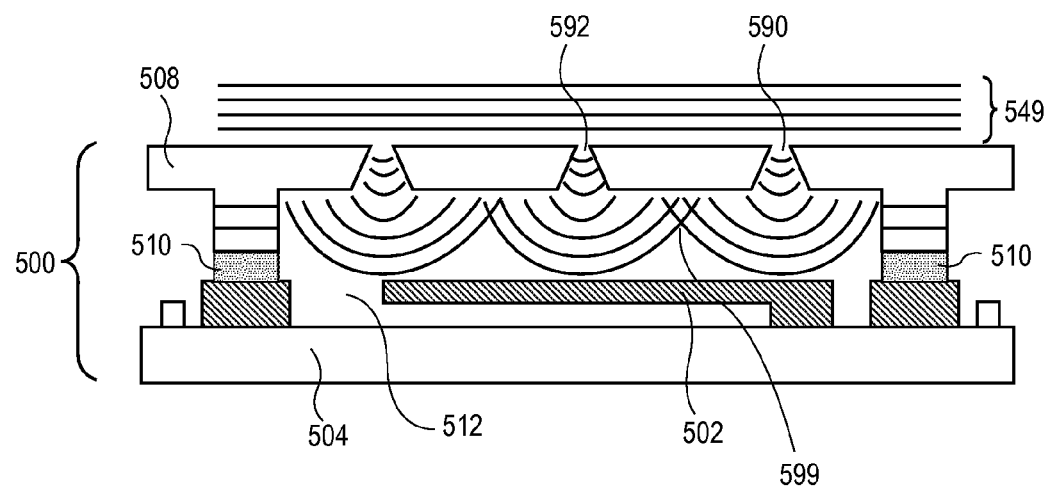
FIG. 5 illustrates a side-on cross-sectional view representing a MEMS structure having an encapsulated MEMS device, wherein a cap substrate includes an inlet, in accordance with an embodiment of the present invention.

In another aspect of the present invention, an inlet may be included in a cap substrate to provide access to a MEMS device housed in a cavity formed by the cap substrate. FIG. 5 illustrates a side-on cross-sectional view representing a MEMS structure having an encapsulated MEMS device, wherein a cap substrate includes an inlet, in accordance with an embodiment of the present invention.

Referring to FIG. 5, a MEMS structure 500 includes a MEMS device 502. A first (device) substrate 504 is bonded to a second (cap) substrate 508 by a seal ring 510. Thus, in accordance with an embodiment of the present invention, a cavity 512 is disposed between device substrate 504 and cap substrate 508, inside of seal ring 510. MEMS device 502 is housed above device substrate 504 and in cavity 512. An inlet 590 is disposed in cap substrate 508, providing an opening to cavity 512. In one embodiment, inlet 590 includes a V-groove profile having the wider portion closer to MEMS device 502 than the narrower portion, as depicted in FIG. 5. In a specific embodiment, the V-groove profile is formed by etching cap substrate 508 with a hydroxide-based etching solution prior to bonding cap substrate 508 to device substrate 504. In an embodiment, seal ring 510 is composed of silicon-germanium.

Inlet 590 may be a feature formed in cap substrate 508 that exposes MEMS device 502 to the environment outside of cavity 512 and that permits a waveform 549 to propagate from outside of cavity 512 and into cavity 512. In one embodiment, inlet 590 is a waveguide. In an embodiment, inlet 590 is disposed in cap substrate 508 to permit a sound wave to enter cavity 512. In that embodiment, MEMS device 502 is a device such as, but not limited to, a pressure sensor, an acoustic sensor or a light sensor. In one embodiment, a second inlet 592 is disposed in cap substrate 508 and is also provided to permit the sound wave to enter cavity 512, as depicted in FIG. 5. In a specific embodiment, inlet 590 and second inlet 592 are arranged to provide a constructive interference 599 of the sound wave and, thus, are arranged in a grating pattern. Such a constructive interference may amplify the sound wave for improved detection by MEMS device 502. In an embodiment, but not depicted, MEMS device 502 is included in an array of MEMS devices housed in cavity 512.

In accordance with another embodiment of the present invention, inlet 590 is disposed in cap substrate 508 to permit an optical wave to enter cavity 512. In that embodiment, MEMS device 502 is a device such as, but not limited to, a pressure sensor, an acoustic sensor or a light sensor. In a specific embodiment, MEMS device 502 is an optical sensor such as, but not limited to, an infra-red (IR) sensor. In an embodiment, a second inlet 592 is disposed in cap substrate 508 and is also provided to permit the optical wave to enter cavity 512, as depicted in FIG. 5. In a specific embodiment, inlet 590 and second inlet 592 are arranged to provide a constructive interference 599 of the optical wave and, thus, are arranged in a grating pattern. Such a constructive interference may amplify the optical wave for improved detection by MEMS device 502. In an embodiment, but not depicted, MEMS device 502 is included in an array of MEMS devices housed in cavity 512.

It should be recognized that the present invention is not limited to the formation of a single sealed cavity for each bonded wafer pairing. For example, in accordance with an embodiment of the present invention, a plurality of sealed cavities are fabricated from a plurality of metal seal ring and silicon-germanium seal ring pairings disposed on a pair of bonded wafers. In one embodiment, a sealed cavity is provided for each single MEMS device on a device wafer. In another embodiment, each sealed cavity houses a group of MEMS devices. Also, when performing die singulation to provide isolated die with sealed cavities housing MEMS devices, it should be recognized that not every die need be marked with alignment marks. For example, FIG. 4 illustrates a top-down view of a wafer with widows cut therein for use in a die singulation approach, in accordance with an embodiment of the present invention.

Figure 6:
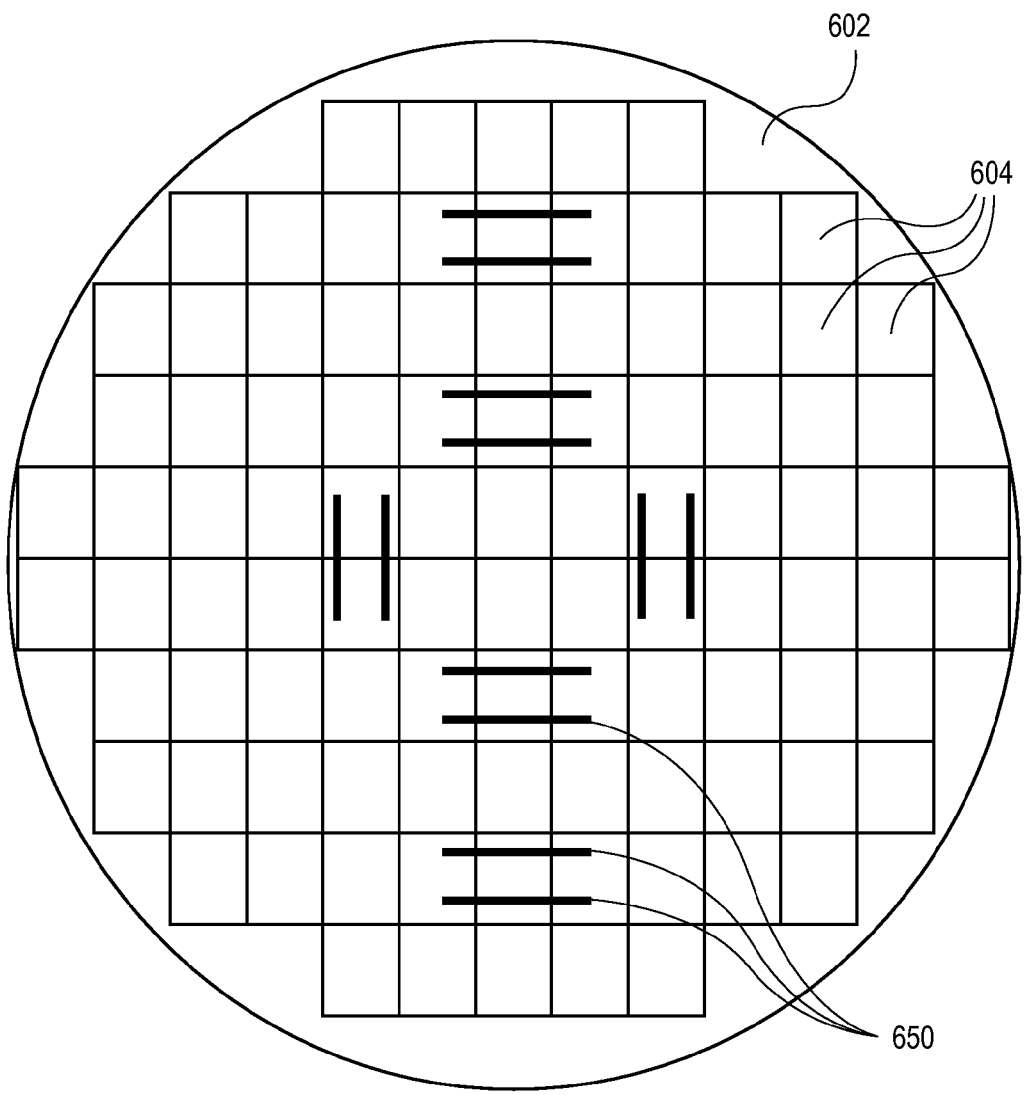
FIG. 6 illustrates a top-down view of a wafer with widows cut therein for use in a die singulation approach, in accordance with an embodiment of the present invention.

Referring to FIG. 6, the backside of a wafer 602 has thereon a grid 604 representing locations of individual die for singulation. Grid 604 is merely provided for illustration purposes and is not necessarily included on the backside of wafer 602. A set of windows 650 is formed in wafer 602. The set of windows 650 may be formed by a technique and have dimensions similar to those described in association with windows 350 from FIGS. 3G-3J. In accordance with an embodiment of the present invention, a window need not be formed for each die. In one embodiment, a sufficient number of windows are provided to enable alignment in a dicing process, but sufficiently few are provided to minimize the impact to the structural integrity of wafer 602, especially during a wafer thinning process, as described above.

Thus, an encapsulated MEMS device and a method to form an encapsulated MEMS device have been disclosed. In accordance with an embodiment of the present invention, an apparatus includes a first substrate having a silicon-germanium seal ring disposed thereon. A second substrate has a metal seal ring disposed thereon. The metal seal ring is aligned with and bonded to the silicon-germanium seal ring to provide a sealed cavity. In one embodiment, a MEMS device is housed in the sealed cavity. In a specific embodiment, the metal seal ring is eutectically bonded to the silicon-germanium seal ring to provide the sealed cavity. In accordance with another embodiment of the present invention, a method includes forming a silicon-germanium seal ring on a first substrate. A metal seal ring is formed on a second substrate. In one embodiment, the metal seal ring is bonded to the silicon-germanium seal ring to provide a sealed cavity that houses a MEMS device. In a specific embodiment, the metal seal ring is bonded to the silicon-germanium seal ring to form a eutectic bond between the metal seal ring and the silicon-germanium seal ring.

What is claimed is:
1. A method, comprising:
    forming a silicon-germanium seal ring on a first substrate on which a MEMS device is disposed inside of a region enclosed by the silicon-germanium seal ring;
    forming a vertical seal ring stack on a second substrate, the vertical seal ring stack including a metal seal ring;
    forming a metal shielding layer on said second substrate including on a sidewall of the vertical seal ring stack;
    bonding said metal seal ring to said silicon-germanium seal ring to provide a sealed cavity that houses the MEMS device, and to electrically couple the MEMS device and the metal shielding layer.

2. The method of claim 1, wherein bonding said metal seal ring to said silicon-germanium seal ring comprises forming a eutectic bond between said metal seal ring and said silicon-germanium seal ring.

3. The method of claim 2, wherein said metal seal ring comprises gold, and wherein said eutectic bond forms at a temperature less than approximately 400 degrees Celsius.

4. The method of claim 2, wherein said metal seal ring comprises aluminum, and wherein said eutectic bond forms at a temperature less than approximately 450 degrees Celsius.

5. The method of claim 1, wherein a width of the wall of said metal seal ring is smaller than a width of the wall of said silicon-germanium seal ring.

6. The method of claim 5, wherein the width of the wall of said metal seal ring is approximately in the range of 20-40 microns, and wherein the width of the wall of said silicon-germanium seal ring is approximately in the range of 50-70 microns.

7. The method of claim 1, wherein a combined height of a wall of said vertical seal ring stack and a wall of said silicon-germanium seal ring is approximately in the range of 60-100 microns.

8. The method of claim 1, wherein a second MEMS device is housed in said sealed cavity, and wherein the second MEMS device is disposed on said second substrate, inside of a region enclosed by said metal seal ring.

9. The method of claim 1, wherein said MEMS device is disposed on said second substrate, inside of the region enclosed by said metal seal ring.

10. The method of claim 1, wherein said metal shielding layer comprises a material selected from the group consisting of titanium, tungsten, chromium and alloys thereof.

11. The method of claim 1, wherein bonding said metal seal ring to said silicon-germanium seal ring comprises bonding in a reduced pressure atmosphere.

12. The method of claim 1, wherein bonding said metal seal ring to said silicon-germanium seal ring comprises bonding in an ambient atmosphere.

13. The method of claim 1, wherein bonding said metal seal ring to said silicon-germanium seal ring comprises bonding in an increased pressure atmosphere.

14. The method as recited in claim 1 wherein the metal seal ring has a width, prior to bonding, smaller than a seed layer.

15. The method as recited in claim 1 further comprising:
forming an interconnect in the first substrate to electrically couple the MEMS device through the interconnect, the silicon-germanium seal ring, and the metal seal ring, to the metal shielding layer.

16. The method as recited in claim 1 further comprising:
forming the metal shielding layer on the sidewall of the vertical seal ring stack inside of a region enclosed by said metal seal ring.

17. The method as recited in claim 1 further comprising:
forming the metal shielding layer on the sidewall of the vertical seal ring stack outside of a region enclosed by said metal seal ring.

18. The method as recited in claim 1 further comprising:
forming a grounding interconnect on the second substrate that is electrically connected through the metal shielding layer to the MEMS device after the bonding.

19. The method as recited in claim 1 comprising:
forming a set of trenches in a top surface of said second substrate, outside of the region enclosed by said metal seal ring;
thinning said second substrate, from a bottom surface of said second substrate, to expose said set of trenches and to provide a set of windows in said second substrate;
dicing said second substrate outside of the region enclosed by said metal seal ring, wherein said set of windows is used as a set of alignment marks for the dicing; and
dicing said first substrate outside of the region enclosed by said silicon-germanium seal ring.

20. The method of claim 19, wherein each trench of said set of trenches is formed to a depth approximately in the range of 100-400 microns.

21. The method of claim 19, wherein thinning said first substrate comprises grinding the bottom surface of said first substrate.

22. A method comprising:
forming a silicon-germanium seal ring on a first substrate;
forming a metal seal ring above a second substrate, wherein said metal seal ring is formed as part of a metal seal ring stack;
bonding said metal seal ring to said silicon-germanium seal ring to provide a sealed cavity that houses a MEMS device;
forming a metal shielding layer on said second substrate including on a sidewall of the metal seal ring stack, inside of a region enclosed by said metal seal ring, prior to bonding said metal seal ring to said silicon-germanium seal ring; and
forming an interconnect in the first substrate to electrically couple the MEMS device through the interconnect and the silicon-germanium seal ring to the metal shielding layer.

23. A method, comprising:
forming a silicon-germanium seal ring on a first substrate;
forming a metal seal ring on a second substrate;
forming inlets in the second substrate to provide an opening to a cavity, the inlets having a V-groove profile with a wider portion closer to the MEMS device, the inlets arranged to provide constructive interference of sound waves; and
bonding said metal seal ring to said silicon-germanium seal ring to provide the cavity that houses a MEMS device disposed on the first substrate.

24. A method, comprising:
forming a silicon-germanium seal ring on a first substrate;
forming a metal seal ring on a second substrate;
forming inlets in the second substrate to provide an opening to a cavity, the inlets having a V-groove profile with a wider portion closer to the MEMS device, the inlets arranged to provide constructive interference of optical waves; and
bonding said metal seal ring to said silicon-germanium seal ring to provide the cavity that houses a MEMS device disposed on the first substrate.

* * * * *